United States Patent
Gross

(10) Patent No.: US 7,375,434 B2
(45) Date of Patent: May 20, 2008

(54) SEMICONDUCTOR CHIP WITH FLEXIBLE CONTACTS AT A FACE

(75) Inventor: Harald Gross, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/938,845

(22) Filed: Sep. 13, 2004

(65) Prior Publication Data

US 2006/0055055 A1    Mar. 16, 2006

(51) Int. Cl.
*H01L 23/48* (2006.01)
*H01L 23/52* (2006.01)
*H01L 29/40* (2006.01)

(52) U.S. Cl. .............................. 257/779; 257/E23.021

(58) Field of Classification Search ................ 257/779, 257/784, 785, 786, 734, 773, 774, 782, 666, 257/679, 674, 777; 361/776; 438/612
See application file for complete search history.

(56) References Cited

U.S. PATENT DOCUMENTS

| | | | |
|---|---|---|---|
| 5,260,596 A * | 11/1993 | Dunn et al. | 257/414 |
| 5,656,553 A | 8/1997 | Leas et al. | |
| 5,723,894 A * | 3/1998 | Ueno et al. | 257/415 |
| 6,439,898 B2 * | 8/2002 | Chua et al. | 439/81 |
| 6,939,735 B2 * | 9/2005 | Smith et al. | 438/106 |

* cited by examiner

*Primary Examiner*—David A Zarneke
(74) *Attorney, Agent, or Firm*—Patterson & Sheridan, L.L.P.

(57) ABSTRACT

The present invention relates to a semiconductor chip comprising a semiconductor element, at least a conducting line and a contact area being arranged on the semiconductor element, the conducting line being connected with the contact area, the contact area being disposed for contacting another electrical contact, characterised in that the semiconductor element comprises at a face of the semiconductor element a flexible arm formed out of the semiconductor element and the contacting area being arranged on the arm.

13 Claims, 8 Drawing Sheets

Contact Socket Frame

Contact Socket Frame

SEMICONDUCTOR CHIP WITH FLEXIBLE CONTACTS AT A FACE

TECHNICAL FIELD OF THE INVENTION

The present invention refers to a semiconductor chip, and in particular, to a semiconductor chip having a semiconductor element and at least a conducting line that is electrically connected to a contact area.

BACKGROUND OF THE INVENTION

Conventionally, there are different approaches to provide semiconductor chips of integrated circuits with contact areas. The basic technique is to provide them on the surface of the semiconductor chip as a metal area that is connected by conducting lines with the integrated circuit.

For contacting several semiconductor chips arranged in the stack, it is well known using electrical feed-throughs inside the bulk material to connect the circuitries of the different semiconductor chips via contact pads from the top surface of a semiconductor chip to the bottom surface. The bottom face is also the interface to contact pads of a second chip that adjoins the bottom surface of the first chip with a top face. This approach, however, is disadvantageous since the second semiconductor chip comprises devices or electronic circuits buried underneath the contact pads on the top surface.

In another approach electrical wires are fabricated around the rim of each semiconductor chip of a stack, either along its side face or through a carrier in which the chip is embedded. U.S. Pat. No. 5,656,553 discloses such a stack and the fabrication method for a monolithic electronic module comprising a plurality of stacked planar extending arrays of integrated circuit chips. The fabrication method includes dicing a wafer of integrated circuit chips into a plurality of arrays of integrated circuit chips. The arrays of the integrated circuit chips are then stacked to form an electronic module. A metallization pattern is deposited on a side face of the electronic module to interconnect the various arrays of the integrated circuit chips. This side surface metallization is only used for connecting the semiconductor chips of the stack to each other. This method requires dicing of a wafer into chips in order to continue processing of the wires and other packaging steps, which is typically less cost-effective than a batch fabrication at wafer scale.

SUMMARY OF THE INVENTION

The present invention provides a chip comprising contact areas that improve the quality of contacting the semiconductor chip.

In one embodiment of the invention, there is a semiconductor chip comprising a semiconductor element and at least a conducting line that is electrically connected to a contact area. The semiconductor chip may be, but is not limited to, a simple sensing element or a semiconductor chip with a highly sophisticated integrated circuit, for example a DRAM. More particularly, the invention relates to a semiconductor chip that comprises a flexible arm with a contacting area at a face constituting a microspring contact. The semiconductor chips may be assembled in a stack, whereby each of the semiconductor chips comprises the flexible arm aligned on top of each other. Furthermore, the present invention relates to a method for producing the semiconductor chip with a flexible arm at a face of the semiconductor element. Furthermore, the invention relates to an electrical interconnection system of thinned semiconductor chips of integrated circuits within a stack and a method of packaging the semiconductor chips in a stack.

In another embodiment of the invention, there is a semiconductor chip comprising a semiconductor element, at least a conducting line and a contact area that is arranged on the semiconductor element. The conducting line is connected to the contact area and the contact area is disposed for contacting another electrical contact. The semiconductor element comprises a flexible arm formed out of the semiconductor element at a face of the semiconductor element and the contacting area is arranged on the arm. The contact area with the flexible arm constitute a microspring contact. Therefore, the flexible arm assists a contacting process as the flexible arm is able to compensate a failure in the correct distance between the contact area and the electrical contact that is brought into contact with the contact area. Furthermore, the flexible arm generates a force against the electrical contact by contacting with the electrical contact, said force arising the contacting force between the contact area and the electrical contact. The flexible arm made of the semiconductor element is rigidly fixed to the semiconductor element and therefore provides a high reliability. The flexible arm with the contact area includes a microspring contact that could be used for a temporary test procedure before the semiconductor chips is mounted in a housing. Furthermore, the microspring has the advantage that different temperature expanding coefficients of the chip and the housing could be compensated. Preferably, the microspring contact functions as a cantilever arm.

In addition the flexible arm compensates mechanical stress due to different thermal expansion coefficients of semiconductors and any interface, e.g. plastic sockets. Thus the reliability is in general superior compared to uncompensated devices.

In still another embodiment of the invention, there is a semiconductor element comprising an upper surface and a side surface, whereby the arm is arranged on the side surface. The configuration of the arm at the side surface has the advantage that the arm can be easily manufactured out of the semiconductor element and the upper surface of the semiconductor element is free of the contact area. Therefore, there is more space on the upper surface for conducting lines or electronic devices or integrated circuits.

In yet another embodiment of the invention, there is a semiconductor chip, whereby the semiconductor element comprises a recess in which the flexible arm can pivot contacting another electrical contact. This embodiment has one advantage that space is available for the flexible arm to compensate a misalignment between the semiconductor chip and the electrical contact. Furthermore, the semiconductor chip has a small overall size, although the flexible arm is able to pivot at a relatively large distance to the semiconductor element.

In another embodiment of the present invention, there is a semiconductor element, whereby the flexible arm and the recess are produced by an etching process. Using an etching process has the advantage of shaping the flexible arm with a well-known process that may be used for mass production of semiconductor chips.

In still another embodiment of the present invention, there is a semiconductor element with a recess that is at least as deep as the thickness of the flexible arm in the pivoting plane of the flexible arm. Thus, it is possible to pivot the flexible arm completely in the recess of the semiconductor element in relation to the side surface at which the semiconductor element is arranged.

In yet another embodiment of the present invention, there is a semiconductor chip, whereby the arm is arranged at a given height above a bottom side of the semiconductor element. Thus, the flexible arm may move freely in spite of the semiconductor chips being arranged in a stack.

In another embodiment of the present invention, there is a simple semiconductor chip that is one of several semiconductor chips of a wafer and the arm is shaped from a part of an area that is arranged between the semiconductor chips of the wafer and used for separating the semiconductor chips. Therefore, the area between the semiconductor chips, i.e. the kerf is used for fabricating the flexible arm. The surface of the semiconductor chip is advantageously not reduced by providing the flexible arm.

In still another embodiment of the present invention, there is a stack of semiconductor chips, whereby several semiconductor chips are piled up and electrically contacted by the respective arms of the semiconductor elements with disposed electrical contacts. This arrangement has the advantage that the electrical contacting of the semiconductor chips is achieved by the flexible arms of the semiconductor chips that are arranged at a side face of the stack. Due to the flexible arms, misalignments of the semiconductor chips can be compensated by the flexibility of the flexible arms. This leads to a higher quality of the electric contacts between the stack and the disposed electrical contacts.

In another embodiment of the present invention, there is a method for producing a semiconductor chip with a flexible arm, that is fabricated by an etching process. Semiconductor material can easily be etched and shaped with an etching process that is a well-known technology. Therefore, the semiconductor chip can be produced cheaply and easily.

According to one aspect the fabrication process, the flexible arm is first covered with an dielectric layer and then covered with a conducting layer that connects the contacting area and the conducting line. Thus, the contacting area and the conducting line are isolated against the semiconductor element.

In yet another embodiment of the present invention, there is a method for producing the semiconductor chip, whereby the arm, the conducting area and the conducting line are fabricated from an upper side of the semiconductor element, whereby an undercut is formed under the arm in the semiconductor element by etching and the semiconductor chip is subsequently thinned by a grinding and polishing process from a bottom side of the semiconductor element, until the undercut is reached by the bottom face of the semiconductor element.

In still another embodiment of the invention, there is a semiconductor chip with a semiconductor element with at least a conducting line and a contact area that can be easily brought into contact with an electrical contact. This is achieved by a flexible arm that is made of the semiconductor element comprising the contact area. Due to the flexible arm, larger production tolerances can be used for connecting the semiconductor chip with the electrical contact alone or, in the embodiment of a stack, with several semiconductor chips.

BRIEF DESCRIPTION OF THE DRAWINGS

The invention will be described in more detail below with reference to the exemplary drawings, in which.

DETAILED DESCRIPTION OF THE INVENTION

Figure 1:
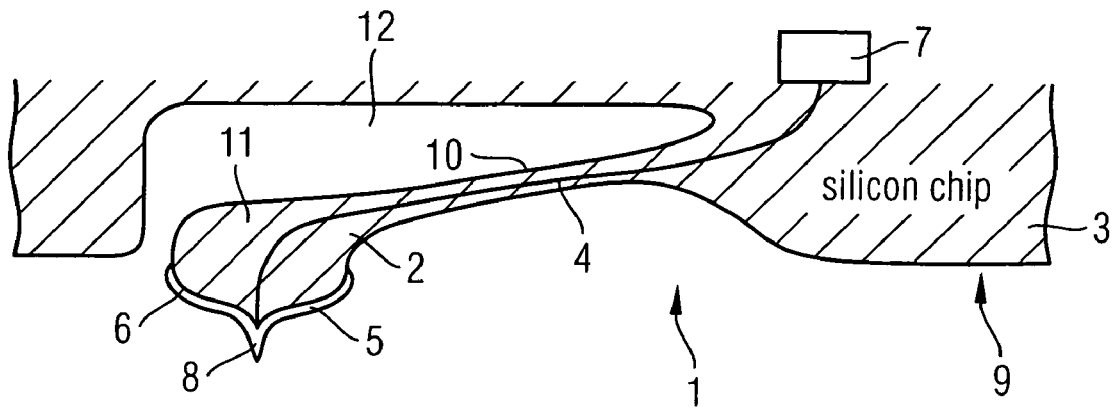
FIG. 1 is a partial view of the top surface of a semiconductor chip.

FIG. 1 depicts a partial cross-sectional view of a semiconductor chip 1. The semiconductor chip 1 comprises a flexible arm 2 that is preferably arranged at a side surface of a semiconductor element 3. The semiconductor chip 1 comprises the semiconductor element 3 with a circuit path 4 which is electrically connected to a contact area 5. The contact area 5 is arranged at a contact face 6 of the arm 2. The circuit path 4 is also connected to a device 7 that is arranged on the semiconductor element 3. The device 7 may be a simple sensing element, such as a resistor, an electric circuit or an electronic circuit. Depending on the embodiment, however, the device 7 may be a dynamic random access memory.

The contact face 6 preferably comprises a contact tip 8. The contact tip 8 is also part of the contact area 5 that is covered with a metal layer, for example consisting of copper, nickel and/or gold. The metal layer is deposited e.g. by means of a electroplating process. The circuit path 4 is preferably deposited by a electroplating process, as well. The semiconductor element 3 preferably consists of silicon, however, it may also be made of materials that may be used for constructing a chip and for fabricating a flexible arm 2.

The flexible arm 2 is arranged at a surface of the semiconductor element 3. Depending on the embodiment, the flexible arm 2 may be arranged on a top, bottom or side surface. FIG. 1 depicts an embodiment of the semiconductor chip 1 that comprises the flexible arm 2 at a side surface 9. The flexible arm is in one piece with the semiconductor element 3 comprising a cantilever portion 10 and a contact portion 11. The cantilever portion 10 emerges from the semiconductor element 3 having a smaller diameter than the contact portion 11. The contact portion 11 carries the contact area 5. The cantilever portion 10 is made of a shape that provides a flexible retention system of the contact portion 11. Between the flexible arm 2 and the semiconductor element 3, a recess 12 is arranged. By contacting the arm 2 with an electrical contact, the arm 2 may pivot in the recess 12. Therefore, recess 12 provides space for pivoting the arm 2 in the direction of semiconductor element 3. In one embodiment of the semiconductor chip 1, the recess 12 is large enough to receive the whole arm 2. The flexible arm 2 constitutes the function of an electrical micro-spring contact. If the contact area 5 is pushed in the direction of the semiconductor element 3, the flexible arm 2 generates a spring force against the motion of the contact area 5. Thus, the contacting force between the contact area 5 and an electrical contact increases.

Figure 2:
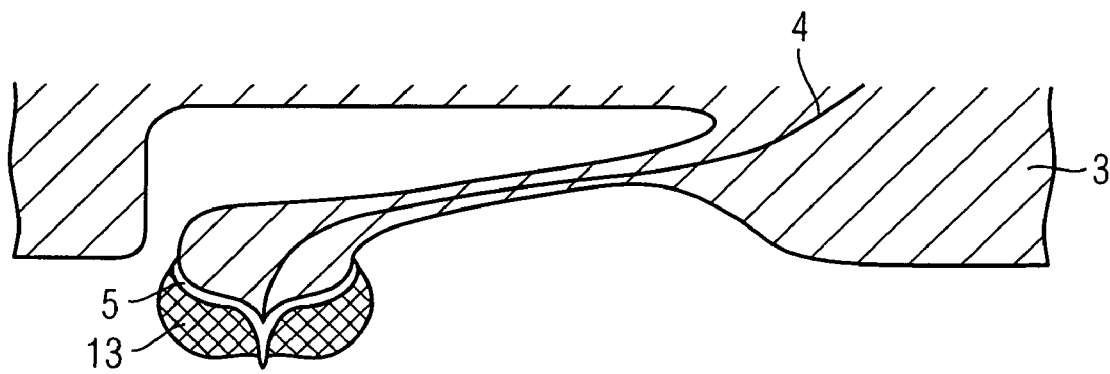
FIG. 2 is a partial view of the top surface of a flexible arm with solder.

FIG. 2 depicts the flexible arm 2 with a contact area 5 on which a solder layer 13 is deposited. For covering the contact area 5 with the solder layer 13, the contact area 5 is dipped into liquid solder.

Figure 3:
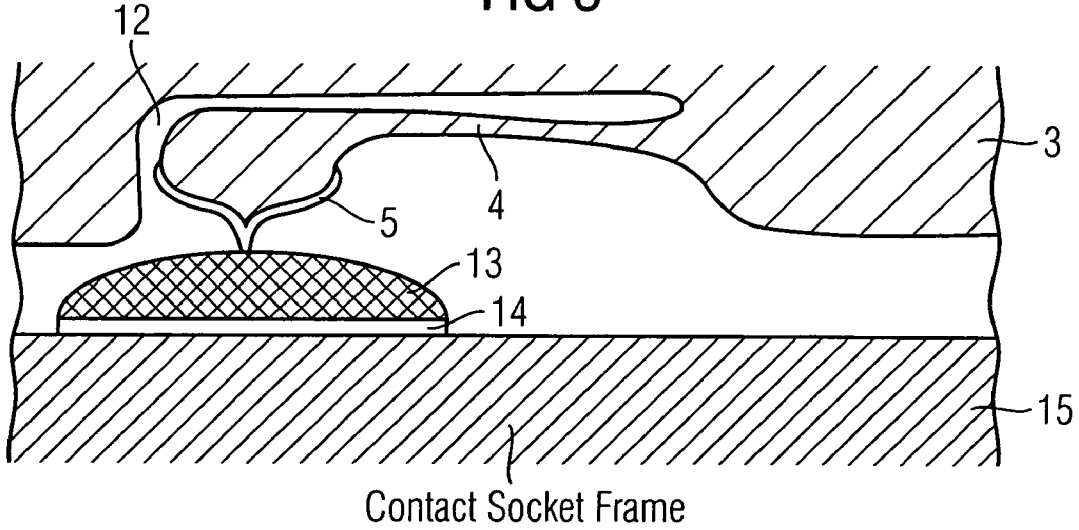
FIG. 3 depicts a top view of a flexible arm and a contact socket frame prior to soldering.
Figure 4:
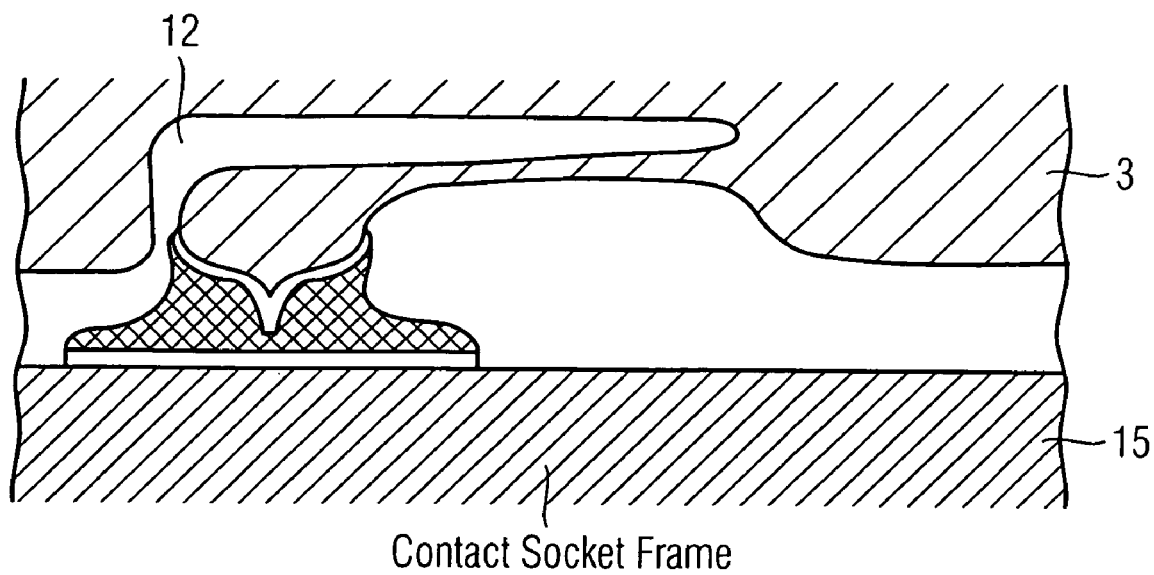
FIG. 4 depicts a top view after soldering the flexible arm to the contact socket frame.

FIG. 3 shows another method for electrically connecting the contact area 5 to an electrical contact 14 that is arranged on a contact socket frame 15. In this embodiment, the electrical contact 14 is constituted as a metal layer that is arranged on a contact socket frame 15. The electrical contact 14 is covered with a solder layer 13. In order to obtain an electrical connection between the contact area 5 and the electrical contact 14, the contact socket frame is pushed against the contact area 5 as shown in FIG. 3. In this situation already, the flexible arm 2 is pivoted in the recess 12. Then the solder layer 13 is heated and cooled down as shown in FIG. 4. Depending on the embodiment, the contact area 5 and the contact socket frame 15 may also be pressed against each other after heating up the solder layer 13. After cooling down the solder layer 13, an electrical connection is achieved between the contact area and the electrical contact 14. Thus, the circuit path 4 and the devices that are connected to the circuit path 4 are electrically connected to the electrical contact 14 of the contact socket frame 15. Instead of the method shown in FIG. 3, the solder could be deposited on the contact area 5, as shown in FIG. 2 and the contact area 5 is then pressed to the electrical contact 14 of the contact socket frame 15. After heating and cooling, an electrical connection is achieved between the contact area 5 and the electrical contact 14. According to this method, the solder layer 13 is deposited on the contact area 5 before pressing the contact area 5 against the electrical contact 14.

Figure 5:
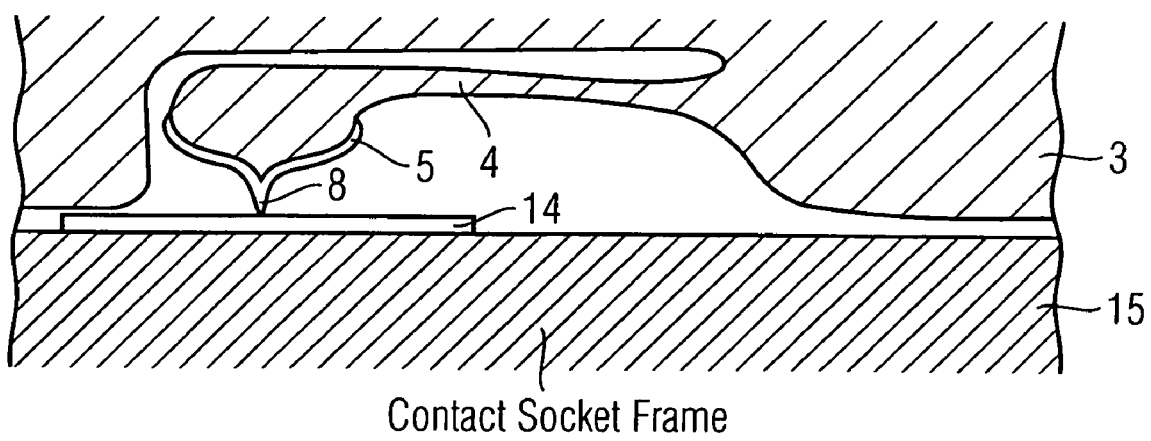
FIG. 5 depicts a further embodiment of an electrical connection between a flexible arm and the contact socket frame.

Depending on the embodiment, it might not be necessary to provide a solder layer 13 and the electrical contact between the contact area 5 and the electrical contact 14 could be achieved by pressing the contact socket frame against the contact tip of the contact area 5 with the electrical contact 14, as shown in FIG. 5. As a consequence of the spring force of the flexible arm 4, the contact tip 8 is biased against the electrical contact 14. Due to the pre-tensional force, a good and reliable electrical contact is provided between the contact area 5 and the electrical contact 14.

Figure 6:
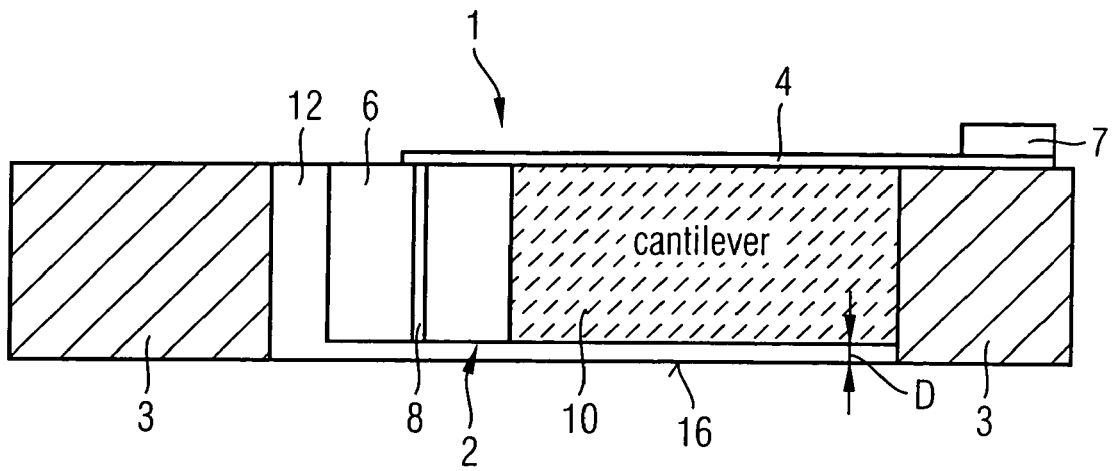
FIG. 6 depicts a schematic side view of the flexible arm prior to soldering.

FIG. 6 depicts a schematic side view of the side surface of the semiconductor chip 1. The circuit path 4 is arranged on the top surface of the semiconductor element 3 and electrically connected to the contact face 6 that is arranged on the contact area 5 at the side surface of the flexible arm 2. The flexible arm 2 starts at the top surface of the semiconductor element 3 and reaches down along the side surface of the semiconductor element 3 at a given distance D from the bottom surface of the semiconductor element 3. The distance D from the bottom surface 16 of the semiconductor element 3 has the advantage that the flexible arm 2 may also move freely, although the semiconductor element 3 is arranged on a top surface of another semiconductor chip 1. FIG. 6 shows a lateral view of FIG. 1.

Figure 7:
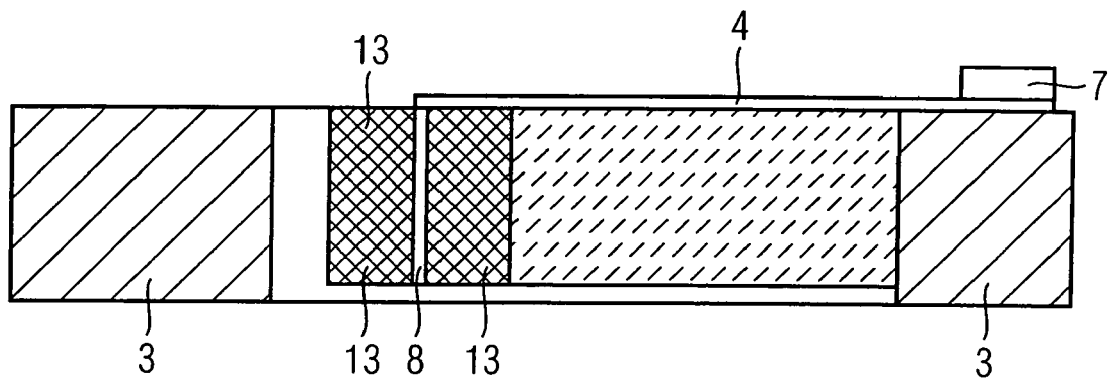
FIG. 7 depicts a side view of the flexible arm after soldering the contact area.

FIG. 7 depicts a lateral view of FIG. 2. The difference between FIG. 7 and FIG. 6 is in that on the contact face 6, a solder layer 13 is deposited. In the schematic views of FIG. 6 and FIG. 7, the device 7 is depicted as a rectangle, whereas the devices 7 are realized as planar integrated circuits.

Figure 8:
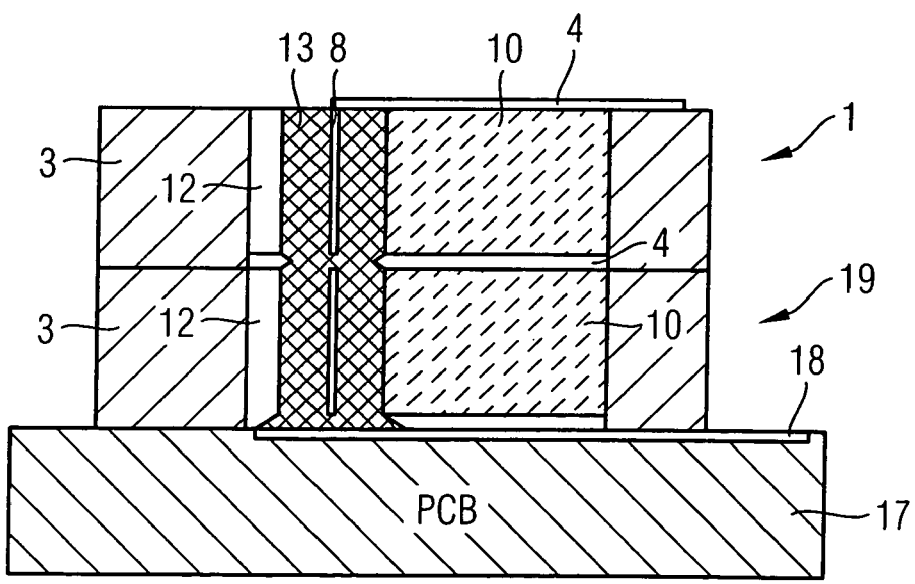
FIG. 8 depicts a side view on a stack of semiconductor chips that are arranged on a printed circuit board after soldering.

FIG. 8 depicts a schematic side view of a first stack 17 comprising two semiconductor chips 1, 19 that are arranged upon each other. The first semiconductor chip 1 is arranged on the second semiconductor chip 19. The second semiconductor chip 19 is arranged on a printed circuit board 17. On an upper surface, the printed circuit board 17 comprises an electrically conductive layer 18. The second semiconductor chip 19 is arranged with its contact face 6 above the conductive layer 18, whereby the contact face 6 of the second semiconductor chip 19 is covered with a solder layer 13 that is also in contact with the conductive layer 18. Furthermore, the solder layer 13 also covers the contact face 6 of the first semiconductor chip 1. The first semiconductor chip 1 is arranged on the second semiconductor chip 19 in the same position as the second semiconductor chip 19. Thus, the flexible arms 2 of the first and the second semiconductor chip 1, 19 are arranged on top of each other. The solder layer 13 constitutes an electrical connection between the contact faces 6 of the first and second semiconductor chip 1, 19 and the conductive layer 18 of the printed circuit board 17.

The following FIGS. 9 to 17 depict process steps of a method of producing a semiconductor chip with a flexible arm as a micro-spring contact.

Figure 9:
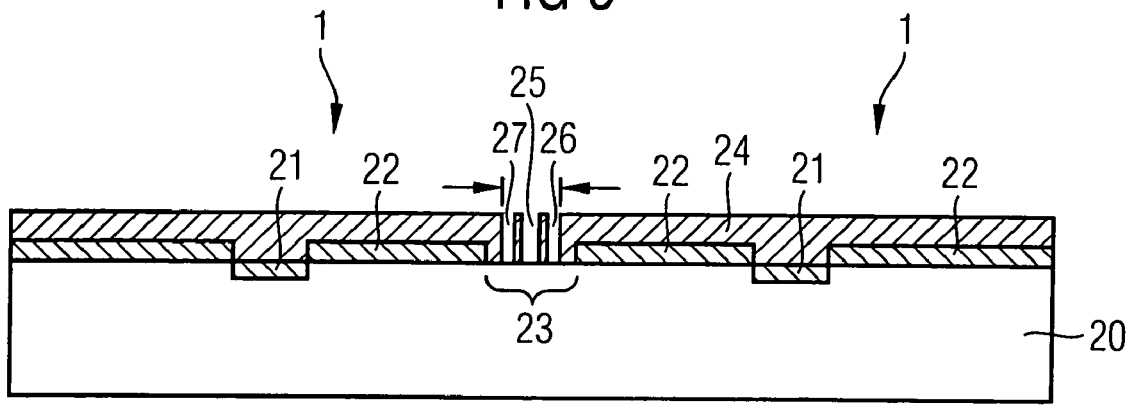
FIGS. 9 to 17 depict cross-sectional views of various process steps of a method of producing a semiconductor chip comprising a flexible arm.

FIG. 9 depicts a cross-sectional view of a wafer 20 with a multitude of semiconductor chips 1, whereby in FIG. 9 only two semiconductor chips 1 are shown. The wafer 20 consists of a semiconductor material, e.g. silicon. On the surface of the wafer 20, two conductive lines 21 are arranged. The conductive lines 21 may include contact pads. The other surface of the wafer 20 is covered by a protective layer 22 that is made of e.g. polyamide. The conductive lines 21 are e.g. made of aluminium. Between the two semiconductor chips 1, a dicing area 23 is disposed which is not covered by the protective layer 22. The dicing area 23 and the protection layer 22 and the conductive lines 21 are covered by a photoresist layer 24. The photoresist layer 24 is structured in the dicing area 23 with a central opening 25 and a first and second side opening 26, 27. For the structuring of the photoresist layer 24, suitable photo masks are used. This process situation is shown in FIG. 9.

Figure 10:
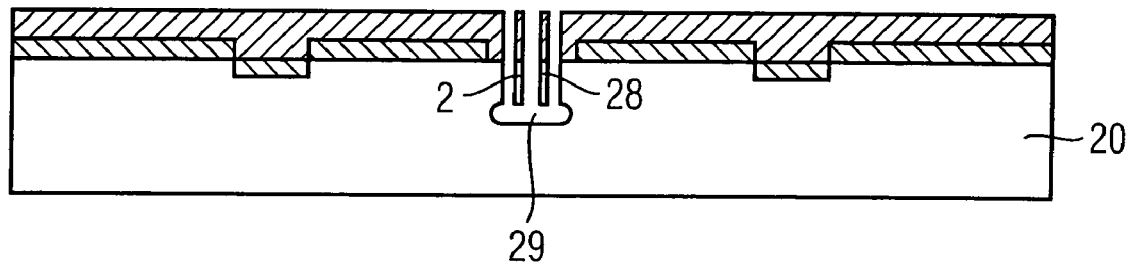

Thereafter, a first and second arm 2, 28 are produced out of the semiconductor material of the wafer 20 using an etching process. Beneath the first and the second arm 2, 28, an undercut 29 is etched into the wafer 20. For etching the first and the second arm 2, 28, an anisotropic etch step is used that continues with an isotropic etch step in order to achieve the undercut 29 of the first and second arm 2, 28. With the anisotropic etch process, the lateral sides of the first and the second arm 2, 28 are fabricated. The undercut 29 is fabricated by means of the isotropic etch step forming a vertical bottom side of the arms 2, 28. Preferably, the anisotropic etch process is used until a depth of 50 µm and the following anisotropic etch process is used for a further depth of 5 µm. This process situation is shown in FIG. 10.

Figure 11:
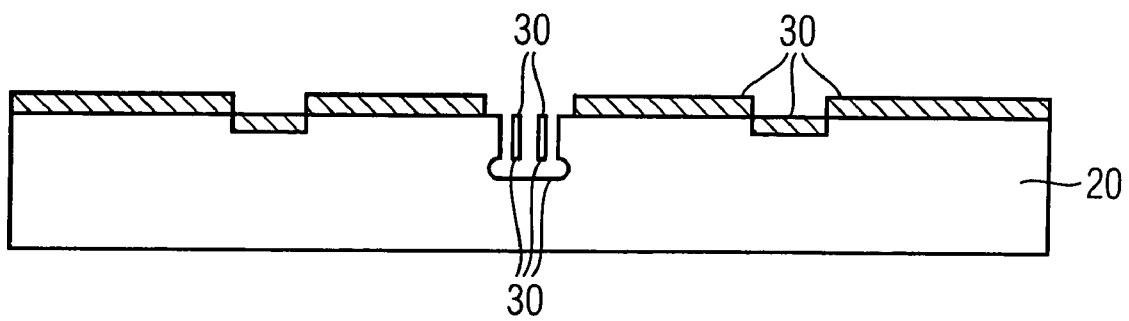

In a following step, a dielectric layer 30, e.g. silicon nitride is deposited on the whole surface of the structured wafer 20. Particularly, the surface of the first and second arm 2, 28 and the surface of the wafer 20 in the region of the first and second side openings 26, 27 and the surface of the undercut 29 are covered by the dielectric layer 30. The silicon oxide layer 30 is preferably deposited by a plasma-enhanced chemical wafer deposition at a temperature of 150° C. This process situation is shown in FIG. 11.

Figure 12:
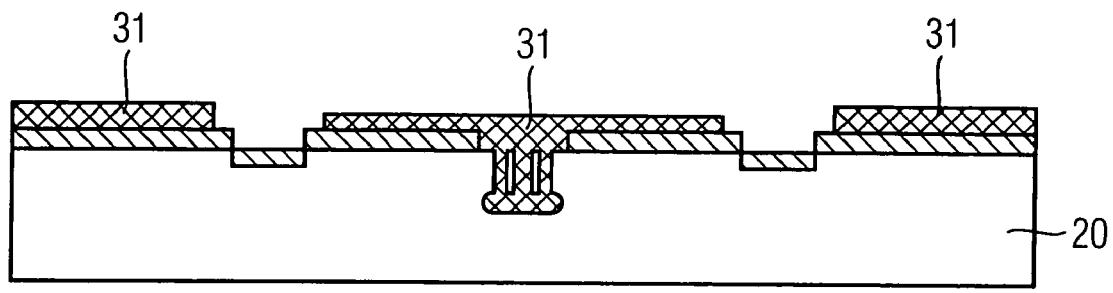

In a further process step, a polymer layer 31 is printed onto the protective layer 22 and the dicing area 23 filling up the central opening 25, the side openings 26, 27 and the undercut 29. Thereafter, the silicon oxide layer 30 is stripped off the conductive lines 21. This process step is shown in FIG. 12.

Figure 13:
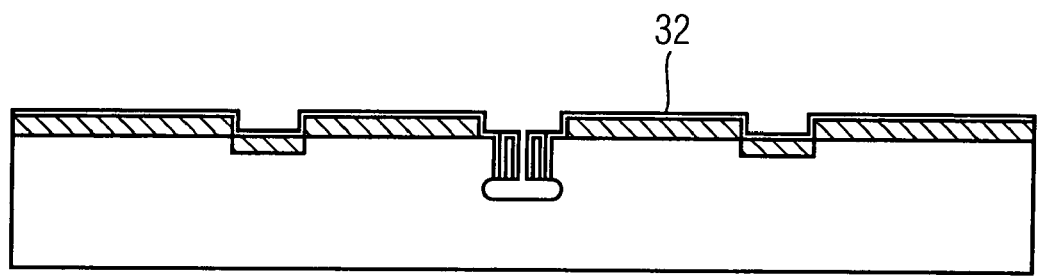

In a further process step, the polymer layer 31 is stripped off. For a simple embodiment of the process, the polymer layer 31 is made of the same material as the photoresist layer 24. After this, a seed layer 32 is deposited on the surface of the structured wafer 20. The seed layer is deposited on the whole surface and within the etching chamber 29 and on the surface of the first and second arm 2, 28, as well. As a material for the seed layer, e.g. titanium-copper may be used. This situation is shown in FIG. 13.

Figure 14:
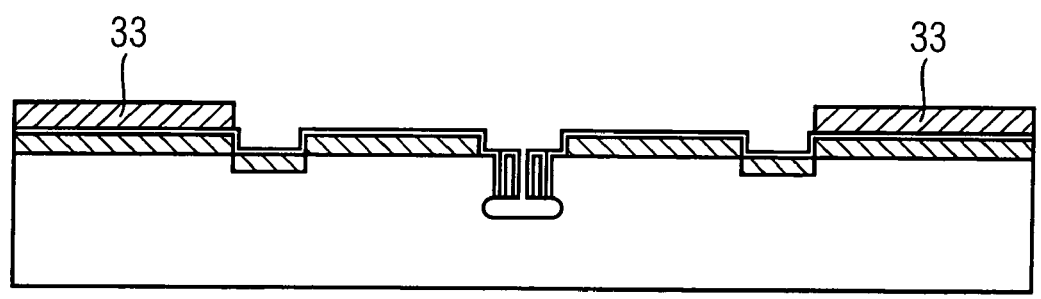
Figure 15:
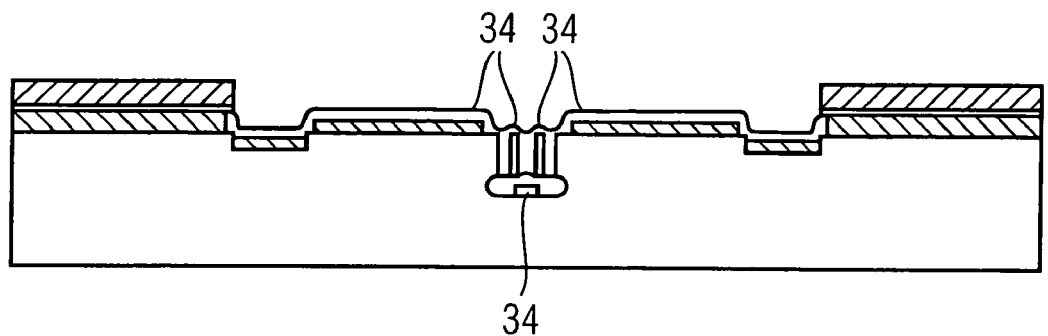

In a further process step, a first and a second side region next to the conductive line 21 is covered by a electrophoretic photoresist layer 33. This process step is shown in FIG. 14. In a further process step, a metal layer 34 is deposited in the region that is not covered by the second photoresist layer 33, e.g. by an electroplating process. The metal layer 34 covers the conductive lines 21, the protective layer 22 and the upper and side faces of the first and second arm 2, 28. In addition, a central part of the bottom face of the undercut 29 is covered by the metal layer 34. Advantageously, the faces of the first and second arm 2, 28 adjoining the central opening 25 are covered by the metal layer 34. This process step is shown in FIG. 15.

Figure 16:
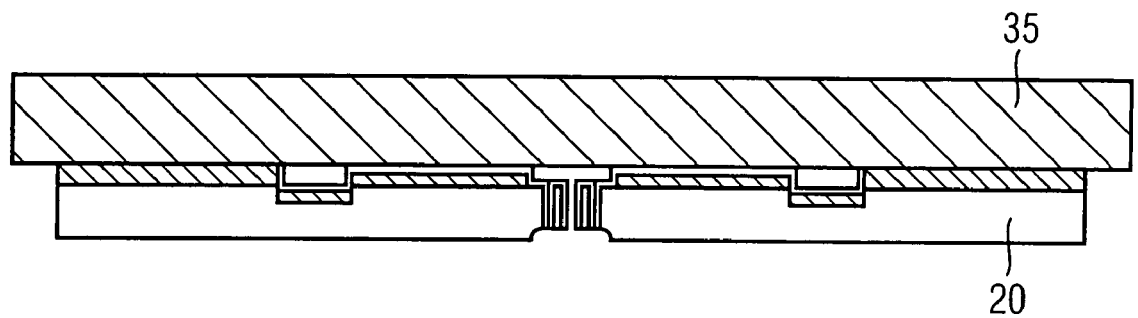

In a following process, the wafer 20 is fixed by its upper surface to a carrier plate 35, as shown in FIG. 16. The carrier plate may e.g. be an adhesive tape or a thin plate with an adhesive layer. The wafer 20 is subsequently thinned out from the bottom face until the etching chamber 29 is reached, as is shown in FIG. 16.

Figure 17:
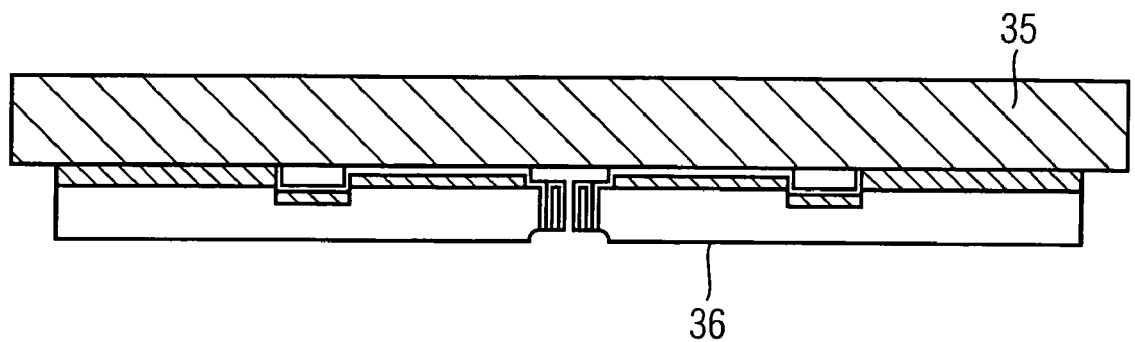

After this step, a polyamide layer 36 is deposited on the bottom side of the wafer 20, as shown in FIG. 17. The polyamide layer 36 is e.g. deposited in a roll printing process. After removing the carrier plate 35 and subsequent curing of the polyimide layer, a multitude of semiconductor chips 1, 19 are obtained from the wafer 20. The handling of the fabrication processes is more easily performed at the wafer level. Thus, the various semiconductor chips 1, 19 are separated after the fabrication processes.

As an etching process, e.g. a plasma-etching process is used for forming the first and second arm 2, 28 that constitute micro-springs at the rim side of each semiconductor chip 1, 19.

Depending on the embodiment of the processes, the plasma etching used for forming the first and the second arm 2, 28 are used for dividing the wafer 20 up into several semiconductor chips 1, 19 that are separated by the following thinning process as shown in FIG. 16. The plasma etching process allows to round off the semiconductor chip corners by a design that prevents chipping particularly for thin dies compared to sawing. The subsequent handling of semiconductor chips may also be less critical. The proposed design allows the testing of dies before packaging in an stack. This increases the yield of the chip stacks.

Figure 18:
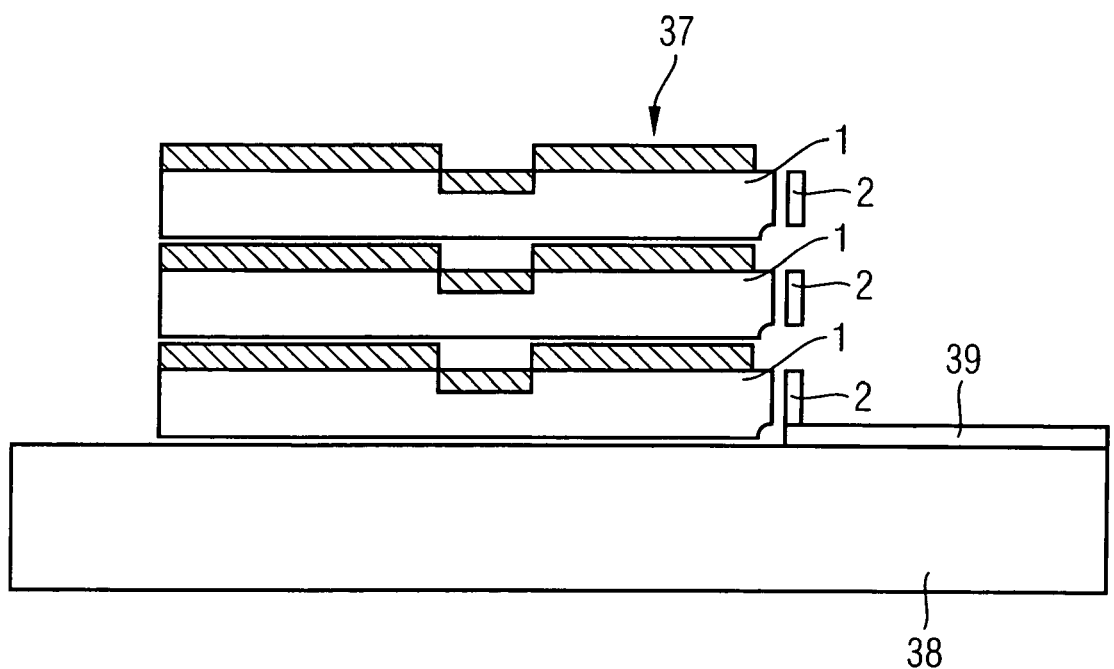
FIG. 18 depicts a cross-sectional view of a stack of semiconductor chips that are glued to each other.

The semiconductor chips 1 may be arranged in a stack 37 as shown in FIG. 18. FIG. 18 depicts a schematic view on a stack of four semiconductor chips 1 in a cross-sectional view. The semiconductor chips 1 are aligned in the same direction, whereby the flexible arms 2 with the contact areas 5 and the contact faces 6 are arranged at the same side of the stack 37. Beside the stack 37, a second conductive layer 39 is arranged on the surface of the second printed circuit board 38.

Figure 19:
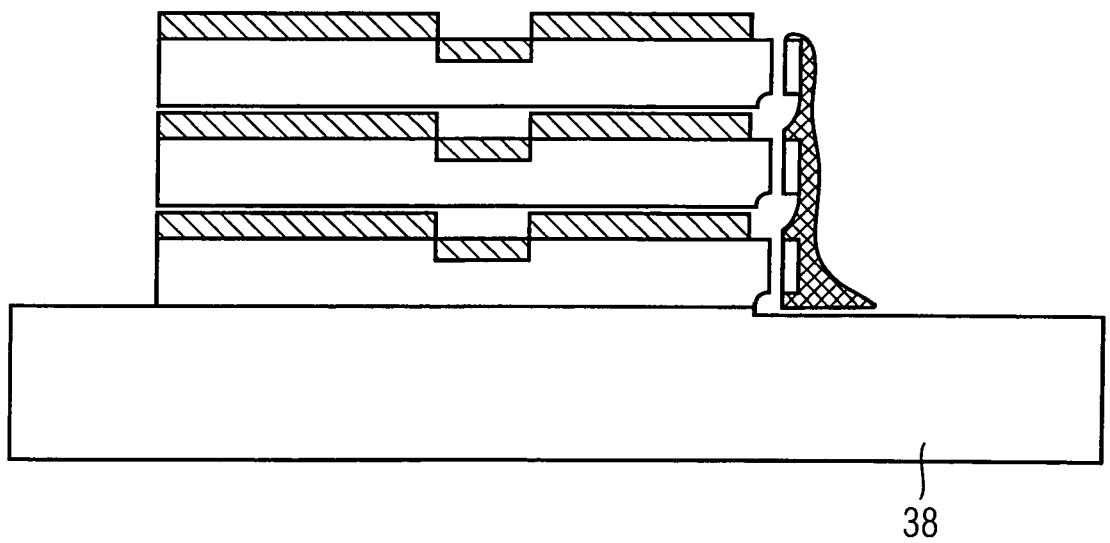
FIG. 19 depicts the stack after dipping it into liquid solder material.

The stack 37 is dipped into a liquid solder 40 that wet the contact faces 6 of the arms 2 of the semiconductor chips 1. Furthermore, the liquid solder covers the second conducting layer 39, as well. After cooling down, an electrical connection between the semiconductor chips 1 and between the semiconductor chips 1 and the second conducting layer 9 is attained by the solder 40, as shown in FIG. 19. Depending on the embodiment, an additional solder stop layer may be used for preventing the liquid solder from flowing into the chamber 12.

Figure 20:
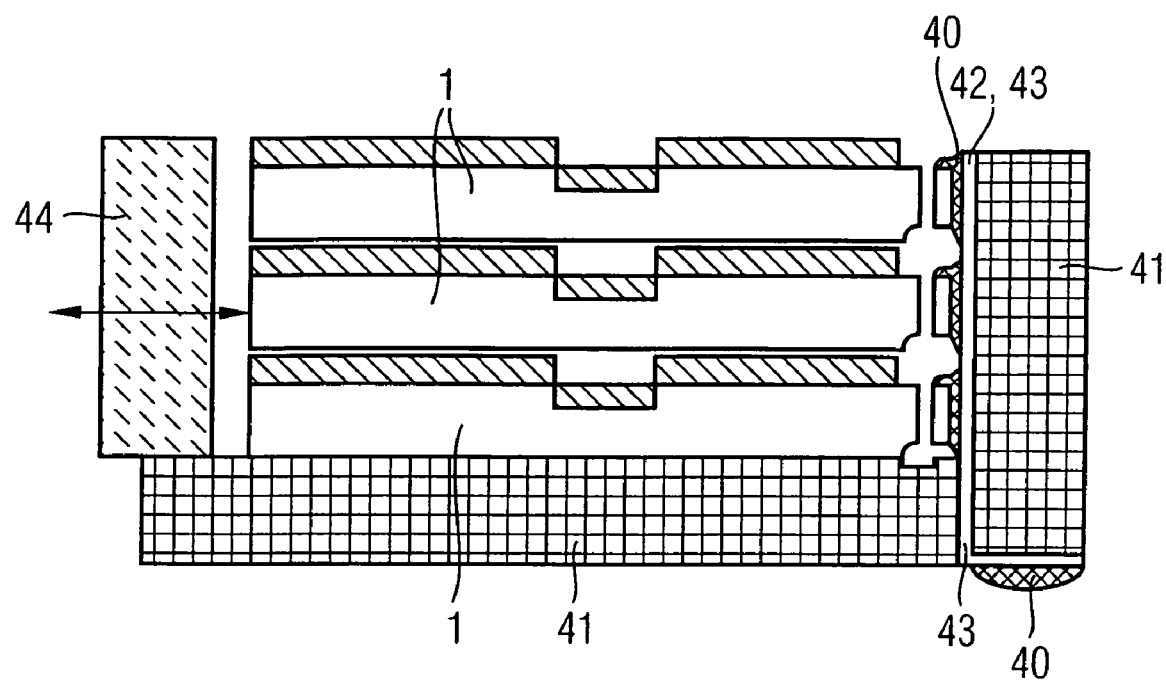
FIG. 20 depicts a cross-sectional view of a stack of semiconductor chips that are pressed against a contact frame.

FIG. 20 shows a cross-sectional view through a stack of semiconductor chips 1 with flexible arms 2 that are put into a socket frame 41. The socket frame 41 comprises a further metal layer 43 at an inner side 42 that is electrically connected by the solder 40 to the contact faces 6 of the arms 2. The stacking is brought into contact with the socket frame by a fastening clip 44. Depending on the embodiment, the semiconductor chips 1 of the stack are optionally tested before and subsequently soldered to the further metal plane 43 of the socket frame 41.

Figure 21:
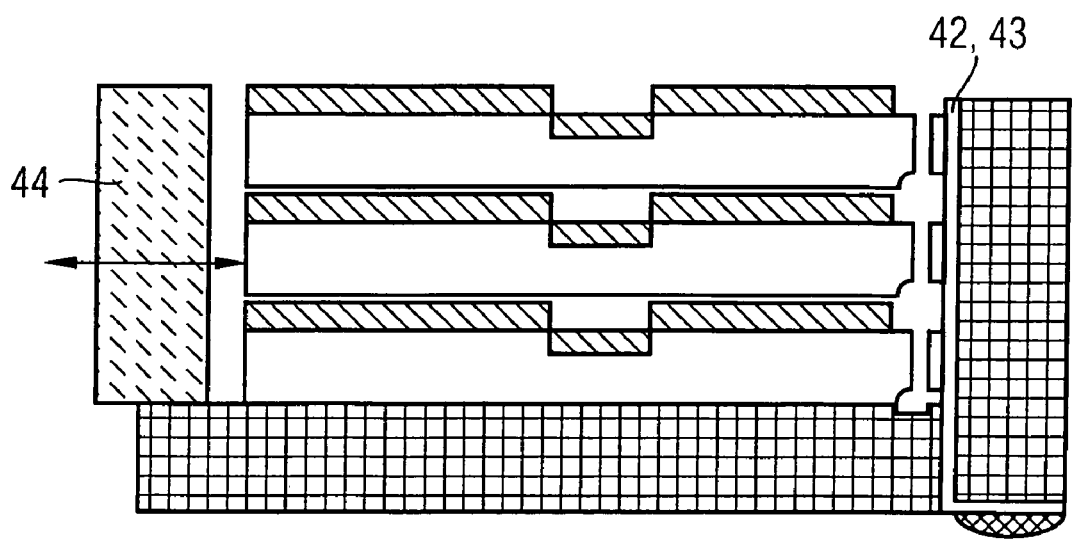
FIG. 21 depicts a cross-sectional view of a stack that is electrically contacted with a contact frame without solder.

FIG. 21 depicts a cross-sectional view of a further embodiment of a stack of semiconductor chips 1 that is electrically connected to a further metal plane 43 of a socket frame 41 without solder 40. In this embodiment, the electrical contact is directly achieved between the further metal plane 43 and the contact face 6 of the arms 2. Therefore, the stack 37 is biased against the socket frame 41. Therefore, a latching clip 44 is used.

The arms 2, 28 with the contact areas 5 and the contact faces 6 may be used as temporary electrical contact sockets for testing the chip 1, 19 or for a permanent anchorage inside of a frame. Moreover, the micro-springs act as a stress release to solder bumps or other hard contacts to the semiconductor chips 1, 19.

What is claimed is:

1. A semiconductor chip, comprising:
   a semiconductor element having a device mounted thereon,
   at least a conducting line, and
   a contact area being arranged on the semiconductor element,
      the conducting line connecting the contact area to the device mounted on the semiconductor element, and
      the contact area being disposed for contacting another electrical contact, wherein
      the semiconductor element comprises an upper surface, a side surface, and a flexible arm disposed on the side surface, the flexible arm being formed out of a same material as the semiconductor element and the contacting area being arranged on the arm, whereby the flexible arm and the contacting area comprise a microspring contact.

2. A semiconductor chip, comprising:
   a semiconductor element having a device mounted thereon,
   at least a conducting line, and
   a contact area being arranged on the semiconductor element,
      the conducting line connecting the contact area to the device mounted on the semiconductor element, and
      the contact area being disposed for contacting another electrical contact, wherein
      the semiconductor element comprises an upper surface, a side surface, and a flexible arm disposed on the side surface, the flexible arm being formed out of a same material as the semiconductor element and the contacting area being arranged on the arm, whereby the flexible arm and the contacting area comprise a microspring contact, wherein the semiconductor element comprises a recess in which the arm can pivot contacting another contact.

3. The semiconductor chip according to claim 1, wherein the arm is formed by an etching process.

4. The semiconductor chip according to claim 2, wherein the recess is formed by an etching process.

5. The semiconductor chip according to claim 2, wherein the recess is at least as deep in a pivoting plane of the arm as a thickness of the arm in the pivoting plane.

6. The semiconductor chip according to claim 1, wherein the arm is arranged at a given height above a lower side of the semiconductor element.

7. The semiconductor chip according to claim 1, wherein a stack of semiconductor chips includes at least two semiconductor chips piled up and electrically contacted by the respective arms of the semiconductor elements with disposed contacts.

8. A semiconductor chip, comprising:
   a part of a wafer,
   at least a conducting line, and
   a contact area being arranged on the part of the wafer, the conducting line being connected with the contact area, and the contact area being disposed for contacting another electrical contact, wherein the part of the wafer comprises an upper surface, a side surface, and a flexible arm disposed on the side surface, the flexible arm being formed out of the part of the wafer and the contacting area being arranged on the arm, whereby the flexible arm and the contacting area comprise a microspring contact.

9. The semiconductor chip of claim 8, wherein the part of the wafer comprises a recess in which the arm can pivot contacting another contact.

10. The semiconductor chip according to claim 8, wherein the part of the wafer comprises a recess in which the arm can pivot contacting another contact and where the recess is at least as deep in a pivoting plane of the arm as a thickness of the arm in the pivoting plane.

11. The semiconductor chip according to claim 8, wherein the arm is arranged at a given height above a lower side of the part of the wafer.

12. The semiconductor chip according to claim 8, wherein a stack of semiconductor chips includes at least two semiconductor chips piled up and electrically contacted by the respective arms of the two semiconductor chips with disposed contacts.

13. A device, comprising:
   at least a first and second semiconductor chip, the first semiconductor chip having at least a conducting line, wherein
      a first contact area is arranged on the first semiconductor chip,
      a second contact area arranged on the second semiconductor chip,
      the conducting line is connected to the first contact area of the first semiconductor chip,
      the first contact area makes contact with the second contact area, and
      at least the first semiconductor chip comprises an upper surface, a side surface, and a flexible arm disposed on the side surface, the flexible arm being formed out of a same material as the first semiconductor chip and the first contact area being arranged on the arm, whereby the flexible arm and the first contact area comprise a microspring contact.

* * * * *